United States Patent [19]

Yamano et al.

[11] Patent Number: 4,772,535

[45] Date of Patent: Sep. 20, 1988

[54] LITHOGRAPHIC PRINTING PLATE MATERIALS WITH LIGHT INSENSITIVE SILVER HALIDE

[75] Inventors: Motozo Yamano; Kazunaka Endo; Eiji Kanada, all of Nagaokakyo, Japan

[73] Assignee: Mitsubishi Paper Mills, Ltd., Tokyo, Japan

[21] Appl. No.: 35,369

[22] Filed: Apr. 7, 1987

[30] Foreign Application Priority Data

Apr. 15, 1986 [JP] Japan .................................. 61-87517

[51] Int. Cl.$^4$ ................................................ G03C 5/54
[52] U.S. Cl. .................................... 430/204; 430/229; 430/230
[58] Field of Search ............... 430/204, 229, 230, 227

[56] References Cited

U.S. PATENT DOCUMENTS

| | | | |
|---|---|---|---|
| 4,247,617 | 1/1981 | Debroyn et al. | 430/228 |
| 4,299,908 | 11/1981 | Ito et al. | 430/234 |
| 4,693,955 | 9/1987 | Torizuka et al. | 430/204 |
| 4,728,596 | 3/1988 | Takaki et al. | 430/230 |

Primary Examiner—Richard L. Schilling
Attorney, Agent, or Firm—Cushman, Darby & Cushman

[57] ABSTRACT

Printing characteristics of a lithographic printing plate material using the silver complex diffusion transfer process and comprising a support and a silver halide emulsion layer and a surface physical development nuclei layer are markedly improved when the emulsion layer comprises two emulsion layers, the lower layer of which has substantially no light-sensitivity.

7 Claims, No Drawings

LITHOGRAPHIC PRINTING PLATE MATERIALS WITH LIGHT INSENSITIVE SILVER HALIDE

BACKGROUND OF THE INVENTION

This invention relates to a novel method for improvement of printing characteristics of offset printing plates made utilizing the silver complex diffusion transfer process, especially, increase in the number of copies obtainable from the offset printing plate without any problems in images on halftone dots and fine lines and remarkable improvement in inhibition of occurrence of printing stains.

Direct use of a silver image obtained by the silver complex diffusion transfer process which is one of the photographic reproduction method as an offset printing master plate has been disclosed in Japanese Patent Unexamined Publication Nos. 43132/71, 30562/73, 55402/74, 106902/77 and 112402/77.

According to a typical embodiment of the silver complex diffusion transfer process suitable for making such lithographic printing plate, when a light-sensitive material comprising a support and, disposed successively thereon, an undercoat layer which serves also as antihalation layer, a silver halide emulsion layer, and a physical development nuclei layer is imagewise exposed and developed, the silver halide in the areas where a latent image has been formed changes into black silver in the emulsion layer. At the same time, the silver halide in the areas where a latent image has not been formed dissolves in a development processing solution or by the action of a complexing agent contained in at least one constituting layer as disclosed in Japanese Patent Examined Publication No. 84743/79 and diffuses towards the surface of the light-sensitive material. The dissolved and diffused silver complex is precipitated by the reducing action of the developing agent on the physical development nuclei in the surface layer to form a silver image. After the development, if necessary, the silver image is subjected to sensitization treatment to enhance its ink receptivity. The material thus treated is mounted on an offset printing machine and the inked image is transferred to a print material.

Various properties required for such printing plate depend on the printing materials and at the same time, depend strongly on plate making process, especially the development step. That is, the state of the transfer developed silver image is an important factor for effect on the printing characteristics and the state depends greatly upon the conditions under which the transferred silver grains are formed, namely, the diffusion speed, stability and reduction speed of silver complex. Printing plates made by development processing in accordance with the diffusion transfer process have the characteristics of high sensitivity, high resolving power and high image-reproducibility, but are inferior in printing endurance and image reproducibility to other commercialized printing plates (e.g., PS plate) and Japanese Patent Examined Publication No. 1057/81 discloses a processing solution for such printing plates obtained as a result of studying silver complexing agents and additives by paying attention to the conditions for formation of transferred silver grains in the development processing such as, for example, diffusion speed, stability and reduction speed of silver complex in an attempt to improve both the printing endurance and the image-reproducibility. However, satisfactory printing endurance has not yet been obtained. Practically, reproducibility of the printing plate in terms of resolving power and printing endurance is about 500 copies in practical limitation of number of copies obtainable without problems in printing of 5% dot images of at least 200 lines/inch. Furthermore, when the thickness of a ruled line of original is less than 50 μm, the ruled line reproduced on the printing plate becomes thinner due to scattering of light, this being unavoidable in case of reflective exposure and as a result, the silver on the plate disappears during printing and reproduction of the thin line becomes impossible.

SUMMARY OF THE INVENTION

The object of this invention is to provide a lithographic printing plate of high printing endurance which is improved in printing characteristics, especially reproducibility of dots and fine lines, number of printable copies and water retention.

DESCRIPTION OF THE INVENTION

That is, this invention relates to a light-sensitive material for making lithographic printing plate by using the silver complex diffusion transfer process which comprises a support and, provided thereon, at least a silver halide emulsion layer and a physical development nuclei layer which is the uppermost layer, characterized in that the emulsion layer comprises two layers and the lower emulsion layer has substantially no light-sensitivity.

"The emulsion layer having substantially no light-sensitivity" should be understood to mean an emulsion layer which is not sensitive by the action of exposure energy provided when a proper imagewise exposure is applied to the light-sensitive silver halide emulsion layer provided on said emulsion layer.

Typical example of the emulsion having substantially no light-sensitivity is a silver halide emulsion subjected to neither chemical sensitization nor spectral sensitization, preferably a silver halide emulsion mainly composed of silver chloride, namely, containing at least about 50 mol % of silver chloride and having an average grain size of 0.25 μm or less, especially 0.2 μm or less.

It has never been expected that printing characteristics of transferred silver image can be improved without occurrence of scumming by providing an emulsion layer having substantially no light-sensitivity under a light-sensitive emulsion layer. This result is considered to occur because firstly chemical development occurs in the exposed area of the light-sensitive silver halide emulsion, which causes difference between the exposed area and the unexposed area in inhibition effect on diffusion and transfer of the non-light-sensitive silver halide emulsion under said light-sensitive emulsion.

The light-sensitive silver halide emulsion for use in the lithographic printing plate materials of this invention can be silver chloride, silver bromide, silver chlorobromide, silver chloroiodide, silver chlorobromoiodide and the like and preferably is a silver halide containing at least 50 mol % of silver chloride. The average gain size of these silver halide is preferably 0.3–0.8 micron. The silver halide emulsion is preferably a monodispersion of silver halide grains, 90% or more of total grains having a size within ±30% of the average size. The grains are preferably in the form of substantially cube or fourteenfaced polyhedron, though those having other crystal habits may be used. The light-sensitive silver halide emulsion can be sensitized in various ways during its preparation or coating. For example, the emulsion may be sensitized chemically by the methods well known to the art by using, e.g., sodium thiosulfate, alkylthiourea, or gold compounds such as gold rhodanide and gold chloride or a mixture thereof. Furthermore, those characteristics such as high sensitivity, high sharpness and high resolving power which are especially desirable for the direct processing printing plates may be imparted by adding at any time during the emulsion preparation compounds of metals of Group VIII of the periodic table such as, for example, salts of cobalt, nickel, rhodium, palladium, iridium, platinum. The amount to be added is in the range of $10^{-8}$–$10^{-3}$ mole for 1 mole of silver halide. The light-sensitive silver halide emulsion layer may be spectrally sensitized depending on the light sources employed and there may be used sensitizing dyes disclosed, for example, in U.S. Pat. No. 4,134,769 and Japanese Patent Unexamined Publication Nos. 71055/84, 71056/84 and 11735/86.

The binder used in the two silver halide emulsions in the lithographic printing plate materials of this invention is usually gelatin which may be partially replaced with one or more hydrophilic polymer binders such as starch, albumin, sodium alginate, hydroxyethyl cellulose, gum arabic, polyvinyl alcohol, polyvinyl pyrrolidone, carboxymethyl cellulose, polyacrylamide, styrene-maleic anhydride copolymer and the like. It is further possible to use an aqueous dispersion (latex) of vinyl polymers.

At least one of the silver halide emulsion layers may contain other additives such as, for example, coating aids, hardeners, antifoggants, matting agents (waterholding agents), and developing agents which are customarily used.

The weight ratio of silver halide in the emulsion layer having substantially no light-sensitivity and the light-sensitive emulsion layer is 3:7–7:3, preferably 1:2–2:1.

Underneath these silver halide emulsion layers (namely, on the support), there may be provided a subbing layer to improve the adhesion or an undercoat layer which may contain a colorant such as carbon black. These layer may contain a developing agent, a matting agent and the like.

An image receiving layer is provided on the silver halide emulsion layer, namely, as an uppermost surface layer.

As physical development nuclei, there may be used those known to the art such as, for example, metals such as antimony, bismuth, cadmium, cobalt, palladium, nickel, silver, lead, zinc and the like and sulfides of these metals. The image receiving layer may contain one or more hydrophilic colloids such as gelatin, carboxymethyl cellulose, gum arabic, sodium alginate, hydroxyethyl starch, dialdehyde starch, dextrin, hydroxyethyl cellulose, polystyrenesulfonic acid, vinyl imidazoleacrylamide copolymer, polyvinyl alcohol, etc. Amount of the hydrophilic colloid contained in the image receiving layer is preferably 1 g/m$^2$ or less.

The image receiving layer may further contain hygroscopic substances or wetting agents such as sorbitol, glycerol, etc. It may also contain anti-scumming pigments such as barium sulfate, titanium dioxide, China clay, and silver, developing agents such as hydroquinone and hardeners such as formaldehyde and dichloro-S-triazine.

The supports can be, for example, paper; films such as cellulose acetate film, polyvinyl acetal film, polystyrene film, polypropylene film, polyethylene terephthalate film; composite films such as polyester, polypropylene or polystyrene film coated with polyethylene film; metals; metallized papers; or metal/paper laminates. A paper support coated on one or both sides with an α-olefin polymer such as polyethylene is also useful. These supports may contain antihalation compounds.

The developing solutions used in this invention may contain alkaline substances such as sodium hydroxide, potassium hydroxide, lithium hydroxide and trisodium phosphate; preservatives such as sulfites; silver halide solvents such as thiosulfates, thiocyanates, cyclic imides, thiosalicyclic acid, amines, etc.; thickners such as hydroxyethyl cellulose, carboxymethyl cellulose, antifoggants such as potassium bromide, 1-phenyl-5-mercaptotetrazole and compounds disclosed in Japanese Patent Unexamined Publication No. 26201/72; developing agents such as hydroquinone, 1-phenyl-3-pyrazolidone; and developing modifiers such as polyoxyalkylene compounds and onium compounds.

In carrying out the silver complex diffusion transfer process, a developing agent is usually contained in silver halide emulsion layer and/or image receiving layer or a water permeable layer contiguous thereto as disclosed, for example, in British Pat. Nos. 1,000,115, 1,012,476, 1,017,273 and 1,042,477. Therefore, when such a material is used in this invention, use may be made of a so-called "alkaline activating solution" containing no developing agent as a processing solution used in developing step.

The lithographic printing plate prepared according to this invention is rendered ink receptive or is enhanced in ink receptivity by use of such compounds as are described in Japanese Patent Examined Publication No. 29723/73 and U.S. Pat. No. 3,721,539.

The printing method, etch (desensitizing) solution and damping solution may be those known to the art.

The emulsion layer having substantially no light-sensitivity used in the following Examples is called "unsensitized silver halide emulsion".

EXAMPLE

On one side of a both-side polyethylene coated paper of 135 g/m$^2$ was provided a matting layer containing silica particles of 5 μm in average particle size and on another side subjected to corona discharge treatment was provided an antihalation layer containing 2 g/m$^2$ hydroquinone, 0.1 g/m$^2$ of 1-phenyl-3-pyrazoline and carbon black and silica particles and thereon were coated an unsensitized silver halide emulsion layer containing silica particles of 5 μm in average particle size and further an orthochromatically sensitized high contrast silver chlorobromide emulsion layer (average grain size 0.4 μm) containing silica particles of 5 μm in average particle size in this order at a coverage of 1.0 g/m$^2$ in terms of silver nitrate for each emulsion layer.

Comparative samples were prepared in the same manner as above, except that said orthochromatically sensitized high contrast silver chlorobromide emulsion was coated on the antihalation layer at a coverage of 2.0 g/m$^2$ in terms of silver nitrate.

The antihalation layer and the emulsion layers contained formaldehyde as a hardener. After drying, the samples were warmed at 40° C. for 3 days and then, 10 g/m$^2$ of palladium sulfide sol prepared in the following way was coated on the emulsion layer.

Preparation of Palladium Sulfide Sol

| Solution A | |
|---|---|
| Palladium chloride | 5 g |
| Concentrated hydrochloric acid | 40 ml |
| Water | 1 l |
| Solution B | |
| Sodium sulfide | 8.6 g |
| Water | 1 l |

Solution A was added to solution B under stirring and after 30 minutes, to the mixture was added 1N sodium hydroxide and pH was adjusted to 4.0 to obtain a coating composition.

In order to examine printing characteristics, thus obtained lithographic printing plate materials were subjected to photographic treatment by camera processor CP-404-II. In this case, in order to make line image, the material was subjected to reflective exposure using line original and in order to make dot image, a photograph original was put on an original stand and a direct gray contact screen: 200 lines/inch (manufactured by Dainippon Screen Mfg. Co., Ltd.) was put on the material in close contact with each other and exposure was conducted. These exposed materials were developed with the following developing solution.

| Developing solution | |
|---|---|
| Sodium hydroxide | 20 g |
| Anhydrous sodium sulfite | 50 g |
| Thiosalicylic acid | 10 mmol |
| 2-Methylamino ethanol | 15 g |
| Water to make up 1 liter. | |

Thus developed materials were then treated with a neutralizing solution of the following composition at 25° C. for 20 seconds to obtain test printing plates.

| Neutralizing solution | |
|---|---|
| Ethylene glycol | 5 g |
| Colloidal silica (20% aqueous solution) | 1 g |
| Citric acid | 10 g |
| Sodium citrate | 35 g |
| Water to make up 1 liter. | |

Thus obtained printing plate was mounted on an offset printing machine, then applied with the following etch solution all over the plate surface and printing was run using the following damping solution.

| Etch solution | |
|---|---|
| Water | 600 ml |
| Isopropanol | 400 ml |
| Ethylene glycol | 50 g |
| 3-Mercapto-4-acetamido-5-n-butyl-1,2,4-triazole | 1 g |
| Damping solution (diluted to 10 times with water after use) | |
| Water | 880 ml |
| Citric acid | 6 g |
| Boric acid | 8.4 g |
| Sodium sulfate | 25 g |
| Ethylene glycol | 100 g |
| Colloidal silica (20% aqueous solution) | 28 g |

The printing machine employed was A. B. Dick 350 CD (trade name for offset printing machine manufactured by A. B. Dick Co.) and the printing ink used was A. B. Dick Offset Ink 3-1012. Printing endurance (reproducibility of dots and fine lines and number of copies obtainable) and water retention characteristic were evaluated in the following manners.

(1) Printing Endurance: Reproducibility of Dots

Simultaneously with contacting an inked roller on the surface of the printing plate, feed of paper was started and the printing endurance was evaluated by the number of printed copies on which 5% dots of 200 lines/inch were reproduced, the number being counted after printed copy of good image density began to be obtained.

(2) Printing Endurance: Reproducibility of Fine Lines

In the same manner as (1), the printing endurance was evaluated by the number of printed copies on which fine lines obtained by reflective exposure to ruled lines of 50 μm were reproduced.

(3) Printing Endurance: Number of Printed Copies

This printing endurance was evaluated by the number of printed copies before disappearance of ink of the image portions began to occur. In this case, printing of more than 1000 copies was continued.

(4) Water Retention: Printing Stains

The surface of the printing plate was over all wetted with water without using etch solution and damping solution and printing was continued using water in place of damping solution and stain of 1000th copy was evaluated by the following three grades:

○: No stain occurred.
Δ: Partial or light stain occurred.
X: Black stain occurred on the whole surface.

The unsensitized silver halide emulsions used in this invention are shown below.

TABLE 1

| Unsensitized AgX emulsion No. | AgCl (mole %) | AgBr (mole %) | Average grain size μm |
|---|---|---|---|
| ① | 90 | 10 | 0.25 |
| ② | " | " | 0.15 |
| ③ | " | " | 0.1 |
| ④ | 100 | — | 0.25 |
| ⑤ | " | — | 0.15 |
| ⑥ | " | — | 0.1 |

TABLE 2

| Printing plate | Unsensitized AgX emulsion No. | Printing endurance | | | (4) Water retention |
|---|---|---|---|---|---|
| | | (1) Dots | (2) Fine line | (3) Number of copies | |
| Comparative sample | None | 500 | 2000 | 5000 | X |
| ① | 1 | 3000 | 5000 | 10000 | ○ |
| ② | 2 | 3000 | 5000 | 10000 | ○ |
| ③ | 3 | 4000 | 6000 | 10000 | ○ |
| ④ | 4 | 4000 | 7000 | 10000~ | ○ |
| ⑤ | 5 | 4000 | 7000 | 10000~ | ○ |
| ⑥ | 6 | 5000 | 10000 | 10000~ | ○ |

From the results shown in the above Tables 1 and 2, it will be recognized that the printing plates having the unsensitized silver halide emulsion layer were much improved over the comparative sample in printing characteristics, namely (1) reproducibility of dots, (2) reproducibility of fine lines, (3) number of printed copies obtainable and (4) water retention property.

As explained above, the offset printing plate materials of this invention can give high printing endurance by providing a silver halide emulsion layer having substantially no light-sensitivity beneath a light-sensitive silver halide emulsion layer. The improvement is remarkable especially in reproducibility of dots and fine lines, number of printed copies obtainable and water retention. Furthermore, if this un-light-sensitive silver halide emulsion layer is present, when photographic additives (inhibitors, reducing agents, development accelerators, etc.) which have very bad effects on the light-sensitive silver halide emulsion layer are added to the unlight-sensitive silver halide emulsion or an undercoat layer for antihalation purpose, the bad effects can be nearly eliminated.

What is claimed is:

1. A light-sensitive lithographic printing plate material which uses the silver complex diffusion transfer process and which comprises a support and, provided thereon, at least a silver halide emulsion layer and a physical development nuclei layer which is provided as an uppermost layer, wherein the emulsion layer comprises two emulsion layers, the lower layer of which is an emulsion layer having substantially no light-sensitivity.

2. A light-sensitive lithographic printing plate material according to claim 1 wherein the emulsion layer having substantially no light-sensitivity comprises a silver halide emulsion which are not subjected to chemical sensitization and spectral sensitization.

3. A light-sensitive lithographic printing plate material according to claim 2 wherein the silver halide emulsion contains at least about 50 mol % of silver chloride.

4. A light-sensitive lithographic printing plate material according to claim 1 wherein the weight ratio of silver halides in the emulsion layer having substantially no light-sensitivity and the light-sensitive emulsion layer is 3:7–7:3.

5. A light-sensitive lithographic printing plate material according to claim 1 wherein a subbing layer or an undercoat layer is provided beneath the silver halide emulsion layer.

6. A plate making method which includes imagewise exposure of the light-sensitive lithographic printing plate material of claim 1 and diffusion transfer development of the thus exposed material to transfer silver halide complexes in the unexposed area to the physical development nuclei layer to form a silver image.

7. A printing method which comprises applying a printing ink to the surface of the images formed on the lithographic printing plate made by the method of claim 6.

* * * * *